United States Patent
Okada et al.

(10) Patent No.: US 6,815,658 B2
(45) Date of Patent: Nov. 9, 2004

(54) TESTING CIRCUIT FOR CHARGE DETECTION CIRCUIT, LSI, IMAGE SENSOR, AND TESTING METHOD FOR THE CHARGE DETECTION CIRCUIT

(75) Inventors: Hisao Okada, Ikoma-gun (JP); Masayuki Takahashi, Kitakatsuragi-gun (JP); Hiroaki Ogawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 219 days.

(21) Appl. No.: 10/252,686

(22) Filed: Sep. 24, 2002

(65) Prior Publication Data

US 2003/0080278 A1 May 1, 2003

(30) Foreign Application Priority Data

Oct. 26, 2001 (JP) .......................................... 2001-329809

(51) Int. Cl.[7] ................................................ H01J 40/14
(52) U.S. Cl. ............................... 250/214 R; 250/214 LS
(58) Field of Search ........................ 250/214 R, 214 LS, 250/214 LA; 324/678, 763, 771, 548, 519, 686

(56) References Cited

U.S. PATENT DOCUMENTS 6,377,056 B1 * 4/2002 Hanzawa et al. ............ 324/678

FOREIGN PATENT DOCUMENTS

JP 6-347514 A 12/1994

OTHER PUBLICATIONS

U.S. patent application Ser. No. 09/821,605 filed Mar. 29, 2001 entitled "Charge Amount Detection Circuit and Two–Dimensional Image Sensor Using Same".

* cited by examiner

*Primary Examiner*—Que T. Le
(74) *Attorney, Agent, or Firm*—Nixon & Vanderhye, P.C.

(57) ABSTRACT

A testing circuit 1, provided between an input terminal IN of an LSI 2 and the CSA 20, includes a switch NSW (a third switch), a capacitor CT which is connected in parallel to the switch NSW, and switches TC1 (a first switch) and TC2 (a second switch) which are connected in series across the capacitor CT. With this arrangement, the circuit including the capacitor CT and the CSA 20 can serve as a reverse amplifier circuit and can input a voltage waveform instead of the charges. Therefore, a conventional charge supply circuit is not necessary when the testing of a reading circuit 16 is carried out.

12 Claims, 12 Drawing Sheets

TESTING CIRCUIT FOR CHARGE DETECTION CIRCUIT, LSI, IMAGE SENSOR, AND TESTING METHOD FOR THE CHARGE DETECTION CIRCUIT

FIELD OF THE INVENTION

The present invention relates to a testing circuit for a charge detection circuit, an LSI, an image sensor, and a testing method for the charge detection circuit for conducting a testing for checking operations of the charge detection circuit which is provided in devices such as image sensor including an X-ray sensor.

BACKGROUND OF THE INVENTION

Conventionally, an X-ray capturing apparatus using films has been widely used as an X-ray medical diagnostic apparatus. However, in recent years, a flat-type X-ray sensor for obtaining image data has been developed in which a photoelectric conversion layer for converting X-rays to charges is provided on a TFT array substrate used in a liquid crystal display device, and it has been close to practical use as an X-ray capturing apparatus.

A schematic arrangement of a conventional, typical image sensor having two-dimensional matrix structure is the same as that as shown in FIG. 2, which is used for description of the embodiments.

More specifically, an image sensor 48 is arranged as shown in FIG. 2 in such a manner that a glass substrate 50 has a photoelectric conversion layer 54 and a bias electrode 52 thereon. On the surface of the photoelectric conversion layer 54 of the glass substrate 50, pixel electrodes 56 aligned in a matrix manner, storage capacitors (pixel capacitors) 17, switching elements 18, scanning lines (row) 10, and data lines (column) 12 are provided. The scanning lines 10 and the data lines 12 are connected to a scan drive unit (gate driver) 14 and a reading circuit (charge detection circuit) 16, respectively.

Thus, the image sensor 48 includes a photoelectric converting section, which is mainly composed of the photoelectric conversion layer 54 and the storage capacitor 17, for converting photons such as X-rays into charges and storing the charges, and the reading circuit 16 for reading signals of charges supplied from the photoelectric converting section.

Here, the following will describe a testing method for checking whether or not a large number of reading circuits 16 integrated into an LSI shown in FIG. 2 operate normally.

In case where a charge supply circuit 100 for carrying out a testing is connected to an input terminal of the LSI including a CSA 20, a circuit diagram is such a circuit diagram as shown in FIG. 12.

In this circuit diagram, in case where TC2 is turned OFF and TC1 is turned ON, a charge Vin×CT is stored in a capacitor CT.

On the other hand, in case where TC1 is turned OFF and TC2 is turned ON, the charge Vin×CT is supplied to the CSA 20. At this point, an output of the CSA 20 becomes voltage of −Vin×CT/Cf, which is eventually outputted as digital data, with respect to Vref.

In the conventional testing method using a charge supply circuit 100, it is possible to check whether the reading circuit operates normally or not by observation of this outputted data. Also, in this testing method, voltage Vin supplied to the charge supply circuit 100 can be varied to the several levels of voltages so as to vary the amount of charges supplied to the CSA 20, so that it is possible to carry out more detailed testing.

Usually, a large number of reading circuits 16 as described above is integrated and incorporated into the LSI. With this, the testing for checking the operations of all reading circuits 16 in the LSI is carried out in such a manner that a probe is provided to the end part of the charge supply circuit 100 shown in FIG. 12, and the probe is sequentially contacted to each terminal of the reading circuit 16. Further, in order to improve the efficiency of measurement, a widely used method is that a testing apparatus having a plurality of charge supply circuits 100 and probes is arranged so that tests for the reading circuits 16 connected to a plurality of terminals are carried out simultaneously.

The above conventional testing method enables the testing relatively easily. However, because the charge supply circuit 100 must be connected to each of the large number of reading circuits 16 integrated so that the testing is carried out by voltage application, the method provides the extreme inefficiency of the measurement. Also, in case where the testing is carried out with respect to a plurality of reading circuits 16 at one time of measurement as described above, conditions such as length of lines differs depending on the difference in physical position of each charge supply circuit. This increases the influence in variation of parasitic capacitance, which causes a difficulty of a highly accurate testing.

In case of the actual testing with respect to the input range of 100 points, prepared are 100 types of input voltages, 100 types of capacitances CT, 100 types of combinations between the input voltage Vin and the capacitance CT, or others.

However, this also arises a problem that such a testing method causes an overload on the charge supply circuits 100, so that it is impossible to carry out an accurate testing for checking the reading circuit 16's operation.

SUMMARY OF THE INVENTION

An object of the present invention is to provide a testing circuit for the charge detection circuit, an LSI, an image sensor, and a testing method for the charge detection circuit, which can accurately carry out a testing for checking operations of the charge detection circuit which requires an extremely accurate detection of charges as that of an X-ray sensor.

In order to achieve the above object, the testing circuit for the charge detection circuit of the present invention, which observes a signal outputted from the charge detection circuit in response to a signal waveform supplied from voltage applying means so as to check whether or not the charge detection circuit operates normally, the testing circuit comprising:

a capacitor for causing the charge detection circuit to serve as a reverse amplifier circuit with respect to voltage input; and switching means for providing the capacitor between an output terminal of the voltage applying means and the charge detection circuit when the charge detection circuit is tested, and for not providing the capacitor when the charge detection circuit regularly operates.

According to the above arrangement, the switching means can switch a testing mode for checking operations and a regular operation mode of the charge detection circuit by not inserting the capacitor in case where the charge detection circuit operates regularly and by inserting the capacitor in case where the testing for checking operations is carried out with respect to the charge detection circuit. Also, it is possible to easily carry out the testing for checking operations of the charge detection circuit.

More specifically, the testing circuit for the charge detection circuit according to the present invention is provided with the capacitor for causing the charge detection circuit to operate as a voltage input circuit, and the switching means for determining whether the capacitor is inserted or not.

With this arrangement, the charge detection circuit can conduct regular operations with the testing circuit provided by deleting (causing not to operate) the capacitor in the regular operation and by inserting the capacitor in the testing for checking operations of the charge detection circuit.

More specifically, in case where the testing for the charge detection circuit is carried out, the capacitor is inserted so that the capacitor and the charge detection circuit can serve as a reverse amplifier circuit. It is possible to easily carry out the testing for checking operations of the charge detection circuit by comparing and observing between the signal waveform applied to the input terminal and the signal waveform outputted.

Further, according to the testing circuit for the charge detection circuit of the present invention, the switching means can switch the regular operation mode and the testing mode for checking operations of the charge detection circuit only by deleting (causing not to operate) or inserting the capacitor, so that the testing circuit for the charge detection circuit can be provided inside devices such as an LSI. Therefore, it is not necessary to connect the conventional charge supply circuit to the input section of the charge detection circuit for the charge supply to the charge detection circuit in the testing for checking operations of the charge detection circuit. This makes it possible to efficiently carry out the testing for checking operations of the charge detection circuit only by supplying the signal waveform to the input terminal.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 11, the following will describe a testing circuit for a charge detection circuit, an LSI, an image sensor, and a testing method for the charge detection circuit according to one embodiment of the present invention.

Figure 2:
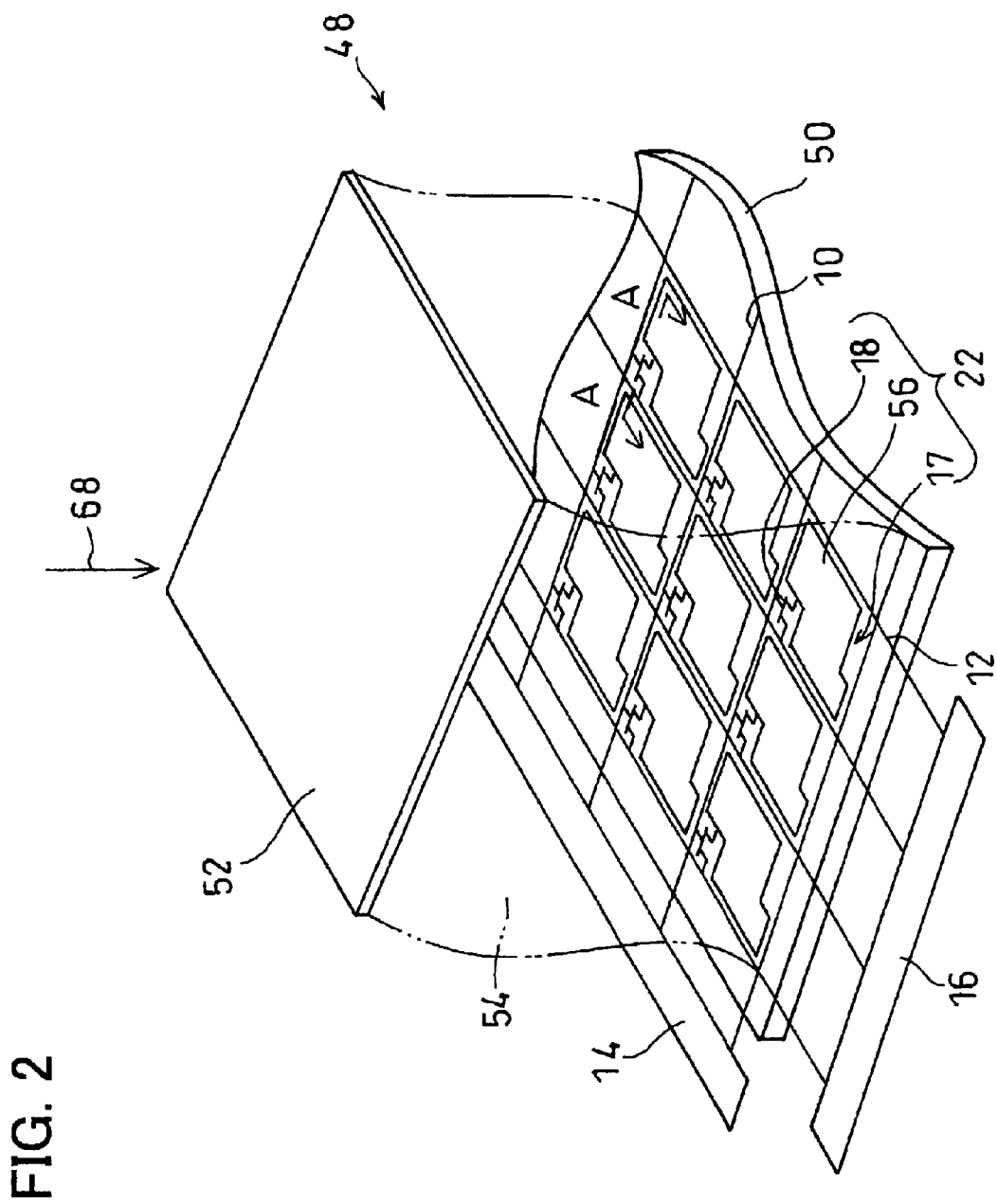
FIG. 2 is a perspective view showing a structure of an X-ray sensor which is provided with the LSI shown in FIG. 1.

A testing circuit 1 (a testing circuit for a charge detection circuit) of the present embodiment is used for a testing for checking whether or not a reading circuit 16, provided in an image sensor 48 shown in FIG. 2, operates normally as a charge detection circuit.

Here, referring to FIGS. 2 and 3, the image sensor 48 and its circuit configuration will be specifically described below.

The image sensor 48 shown in FIG. 2 includes a photoelectric conversion layer 54 and a bias electrode 52 provided on a glass substrate 50. The photoelectric conversion layer 54 is formed by a layer made of, for example, amorphous selenium (hereinafter referred to as "a-Se"). Further, the bias electrode 52 is formed by a metallic film which transmits X-rays, for example, a conductive film made of metals such as gold. On the surface of the photoelectric conversion layer 54 of the glass substrate 50, pixel electrodes 56, storage capacitors (pixel capacitor) 17, switching elements 18, scanning lines (row) 10, and data lines (column) 12 are arrayed in a matrix manner. The scanning lines 10 and the data lines 12 are connected to a scan drive unit (gate driver) 14 and the reading circuit (charge detection circuit) 16, respectively.

Thus, the image sensor 48 includes a photoelectric converting section, which is mainly composed of the photoelectric conversion layer 54 and the storage capacitor 17, for converting photons such as X-rays into charges, and the reading circuit 16 for reading signals of charges supplied from the photoelectric converting section.

The pixel electrode 56 is connected to the data line 12 through the switching element 18. A switching operation of the switching element 18 is performed by voltage supplied from the scan drive unit 14 through the scanning line 10. Therefore, in case where a general thin film transistor (hereinafter referred to as "TFT") is adopted for the switching element 18, a source, a drain, and a gate of the TFT are connected to the pixel electrode 56, the data line 12, and the scanning line 10, respectively. Note that, in the following description, it is assumed that the TFT is adopted for the switching element 18.

Figure 3:
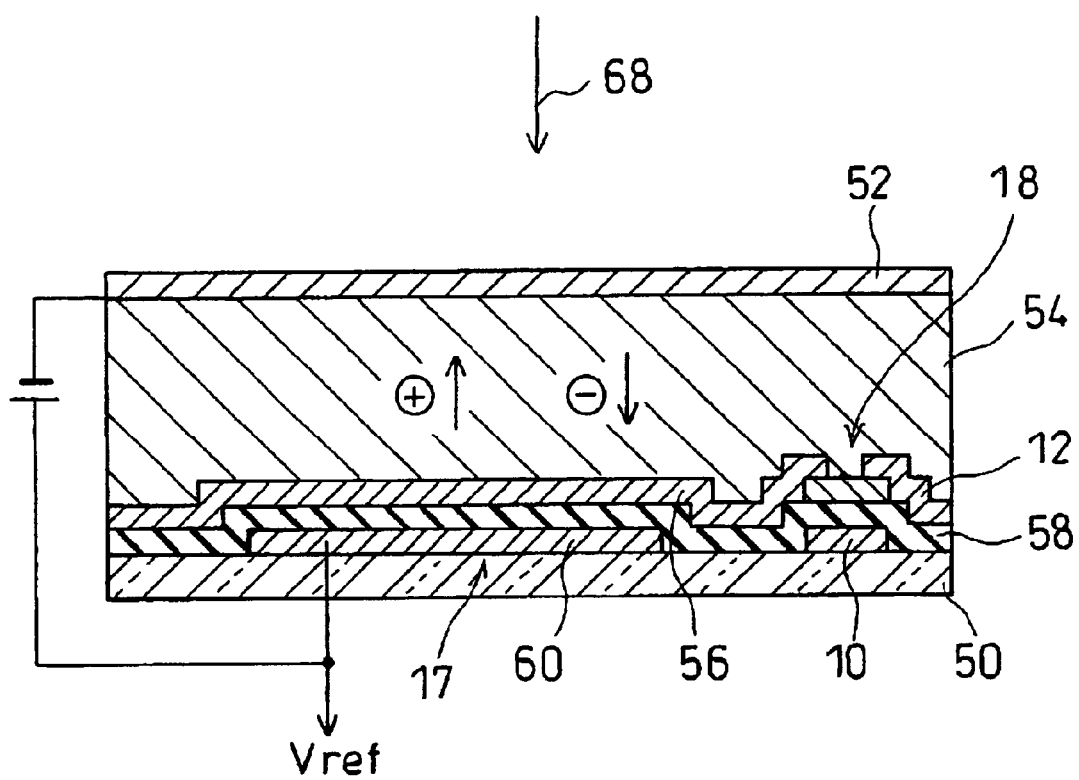
FIG. 3 is a cross-sectional view taken along line A—A of the LSI shown in FIG. 2.

As shown in FIG. 3, which is a cross-sectional view taken along line A—A of the image sensor 48 shown in FIG. 2, an auxiliary electrode 60 is provided at the position opposed to the pixel electrode 56 via an insulating film 58, which constitutes the storage capacitor 17. The auxiliary electrode 60 is wired so that all pixels 22 have a mutual reference voltage (Vref). Note that, the bias electrode 52 is arranged so as to apply a high voltage, for example, thousands of volts to the pixel electrode.

When an X-ray photon 68 is directed from the bias electrode 52 side to the image sensor 48 as described above, the X-ray photon 68, which transmits the bias electrode 52, generates an electron-hole pair in the photoelectric conversion layer 54. Here, a hole, when a positive voltage is applied to the bias electrode 52, or an electron, when a negative voltage is applied to the bias electrode 52, moves to the pixel electrode 56 side and reaches to the pixel electrodes 56 whose positions correspond to the position where the X-ray photon 68 is directed. The hole or electron thus reached to the pixel electrode 56 is stored in the storage capacitor 17. By turning on the switching element 18 which is made up of TFTs, the positive or negative charge (hereinafter referred to as "signal charge") stored in the storage capacitors 17 is flown out to the data line 12, and the reading circuit 16 connected to the data lines 12 reads out the amount of charges (the amount of signal charges).

When the scan drive unit 14 outputs a voltage High to one predetermined scanning line 10, all TFTs connected to the scanning line 10 turns ON state. The signal charges stored in the storage capacitors 17 are flown out to the respective data lines 12. When the scan drive unit 14 sequentially outputs the voltage High to each scanning line 10, data of all pixel electrodes 56 are read out, whereby one image data is read out.

Here, further described is the reading circuit 16 used in the image sensor 48. Note that, the following will mainly describe a charge sensitive amplifier (hereinafter referred to as "CSA"), which is a main element of the reading circuit 16.

Figure 4:
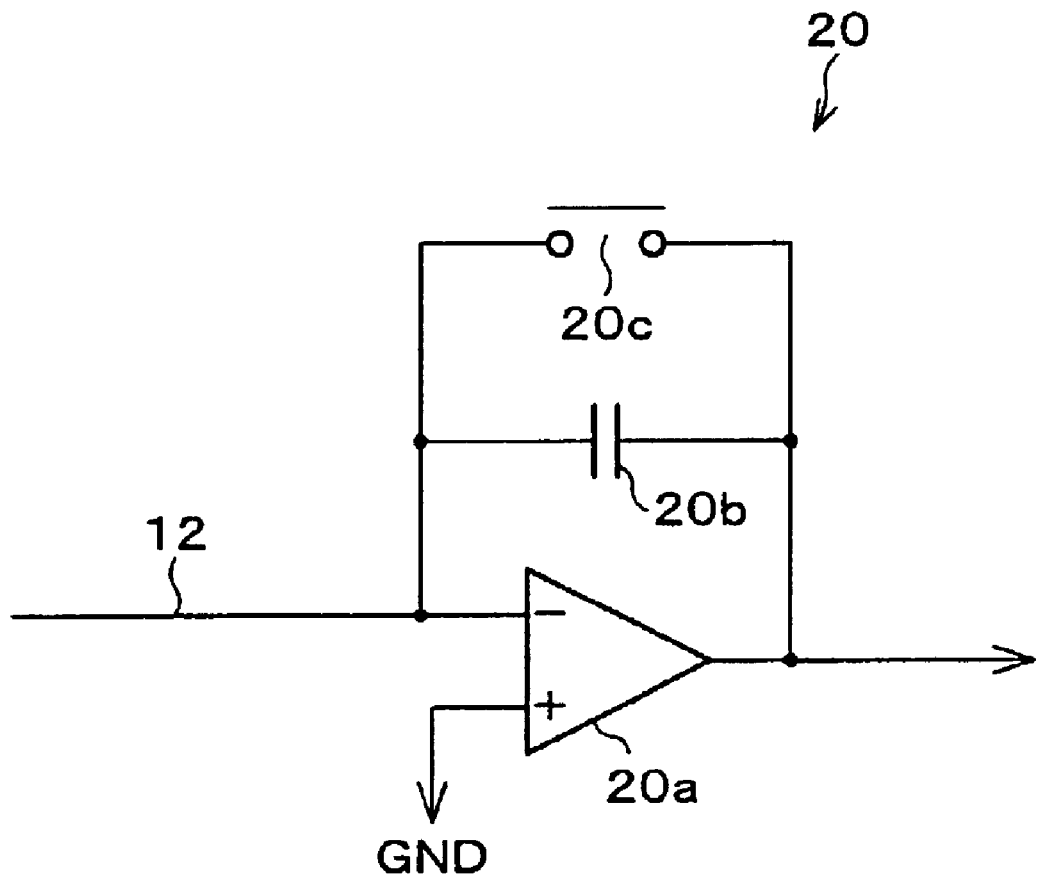
FIG. 4 is a circuit diagram showing a basic arrangement of a charge sensitive amplifier which is provided in a charge detection circuit.

The reading circuit 16, as shown in FIG. 4, includes a CSA 20 to read out the amount of charges.

The CSA 20, in which inverting input and output of an operational amplifier 20a are connected to each other through a feedback capacitor 20b, structures a negative feedback circuit. Further, the feedback capacitor 20b is connected in parallel to a reset switch 20c. With this arrangement, it is possible to discharge the charge stored in the feedback capacitor 20b to reset. An inverting input terminal of the operational amplifier 20a is connected to the data line 12, and a non-inverting input terminal is connected to GND which is a reference potential.

Figure 5:
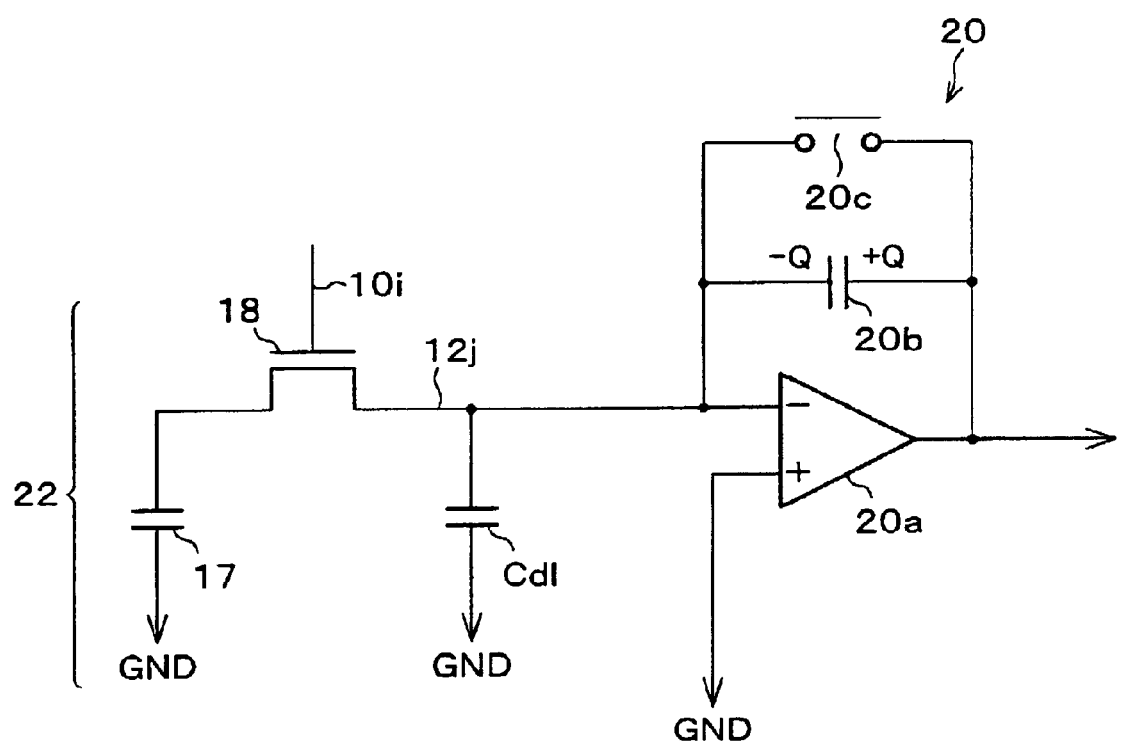
FIG. 5 is a circuit diagram showing an arrangement of an equivalent circuit of pixels and a charge sensitive amplifier corresponding to one data line.

A circuit as shown in FIG. 5 shows an equivalent circuit for reading out one pixel 22 including the storage capacitor 17 and the switching element 18 which is made of TFTs.

It is assumed in FIG. 5 that the pixel 22 is connected to a scanning line 10i which is the scanning line 10 of ith line and a data line 12j which is the data line 12 of jth row. Note that, Cdl represents a capacitor of the data line 12j.

Figure 6:
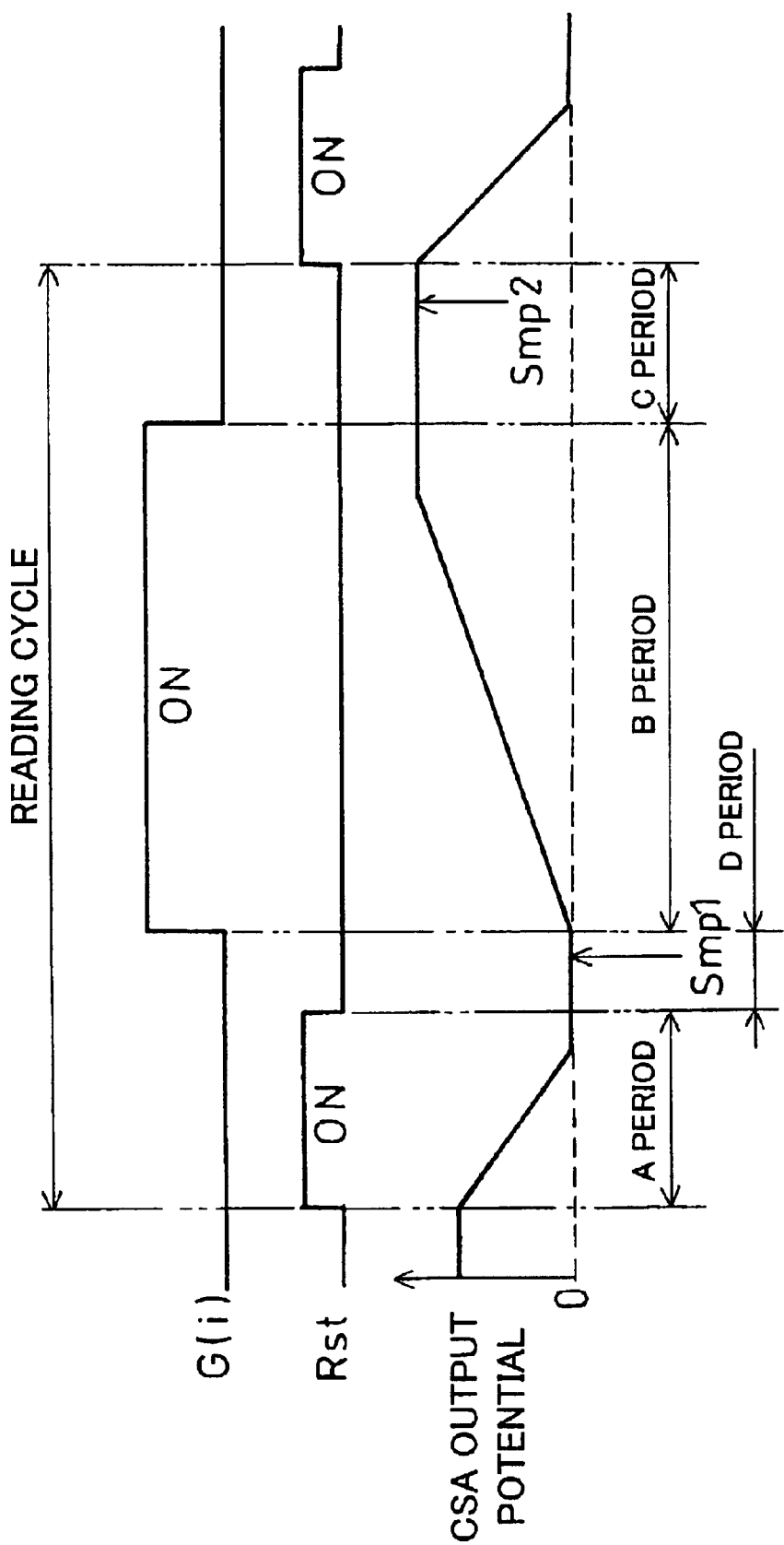
FIG. 6 is an explanatory view showing an operation of reading out a signal charge.

A timing chart of reading operation in FIG. 5 and output potential of the CSA 20 are indicated by a graph as shown in FIG. 6. Note that, G(i) in FIG. 6 represents the voltage outputted to the scanning line 10i, and RST represents a reset signal outputted to the reset switch 20c.

Reading operation starts with turning on the reset switch 20c (A period). This discharges the charge stored by the previous operation in the feedback capacitor 20b and causes the feedback capacitor 20b in a reset state. The output potential of the CSA 20 is set to GND, that is, 0.

Next, after the RST turns Low (D period), the voltage High is outputted to G(i), and the switching element 18 made of TFTs is turned on. Then, the signal charge (−Q) that has been stored in the storage capacitor 17 is flown out to the data line 12j.

The operational amplifier 20a operates so that all charges (−Q) flown out to the data line 12j come together to the electrode of the input side of the feedback capacitor. As a result of this, an equivalent amount of charges (+Q) having a reverse polarity appears at the electrode of output side of the feedback capacitor. Finally, a potential, which is found by the division of a charge Q corresponding to the signal charge by the value of capacitance of the feedback capacitor 20b, appears at the output of CSA 20 (B period). By reading out the foregoing potential, the amount of signal charge can be detected as a potential. Thereafter, the voltage Low is outputted to the G(i) of the line (C period). After a while, the RST is reset again for the reading operation of the next line. Accordingly, this causes the output potential of the CSA 20 to return to GND.

Here, given is the simple description of a potential reading method referred to as correlated double sampling (hereinafter referred to as "CDS").

If a system of the reading circuit shown in FIG. 5 is perfect, the potential read out in the C period should be exactly equivalent to the amount of signal charge. However, actually, the output potential of the CSA 20 does not become GND completely and includes offset in the D period after a reset. As examples of the cause of the offset given are flicker noise and offset of the operational amplifier 20a itself, and the event that heat noise caused by ON resistance of the reset switch 20c is applied to the feedback capacitor Cf at the moment when the reset switch 20c is turned OFF.

By the CDS, the potentials of the CSA 20 are read out at the timings of smp1 and smp2 shown in FIG. 6. By finding a difference between the potentials read out at the smp1 and smp2, it is possible to exactly find the variance in the potential of CSA 20 in the period between the smp1 and smp2. Removing the offset present in the D period by the CDS is the same as reading out the potential in the C period just once in an ideal circuit system in which the offset in the D period is 0. Therefore, to simplify the explanation, the following will describe on the assumption that reading-out is carried out just once in the C period in the ideal circuit system regarded as an equivalent circuit by the CDS.

Figure 7:
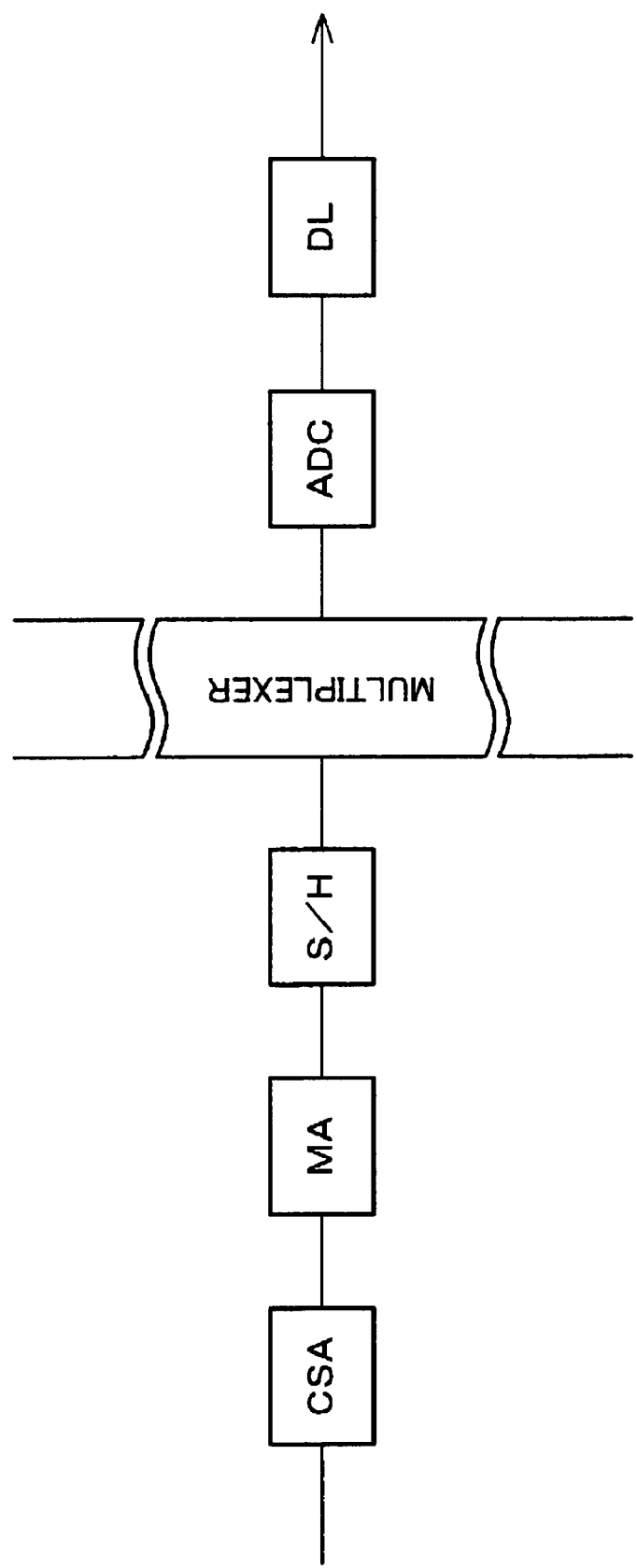
FIG. 7 is a block diagram showing a circuit configuration of a unit reading circuit with respect to one input.

FIG. 7 shows a circuit configuration of a reading circuit (unit reading circuit) that operates until the signal charge is outputted as digital data with respect to one input.

More specifically, the output of the CSA 20 is amplified by a voltage amplifying circuit (main amplifier) (hereinafter referred to as "MA") if necessary, and then, sampled and held by a sample/hold circuit (hereinafter referred to as "S/H"). The held data voltage is inputted to an AD (analog/digital) converter (hereinafter referred to as "ADC") via a multiplexer, converted into a digital value, and held by a data latch circuit (hereinafter referred to as "DL"). Note that, the multiplexer is used for the purpose of assignment of plural input terminals to one ADC and is not essential for the circuit. Therefore, the multiplexer is not necessary, for example, in case where it is arranged in such a manner that one ADC is assigned one input terminal.

The MA is provided to amplify an output voltage to the range of a sufficiently high voltage so that the subsequent circuits can operate in case of a small output voltage of the CSA 20.

In case of a still image filming (a filming mode), which is a general application of an X-ray filming apparatus, an irradiated X-ray dose is sufficiently large. Accordingly, the amount of signal charge of its data is large, and sufficiently large voltage is provided to the CSA 20, so that the MA is not always necessary. However, in case of a filming for obtaining a moving image (a perspective mode), it is necessary to keep X-rays to be irradiated in the time period on the second or minute time scale. To suppress a total amount of an X-ray irradiation, X-rays smaller by two figures than those used in the filming mode. Therefore, the amount of signal charge in the perspective mode is extremely small, as compared with that in the filming mode, so that the MA is necessary. Note that, the MA is indicated as one block in FIG. 7; however, two or more can be adopted in accordance with the amplification factor.

Figure 8:
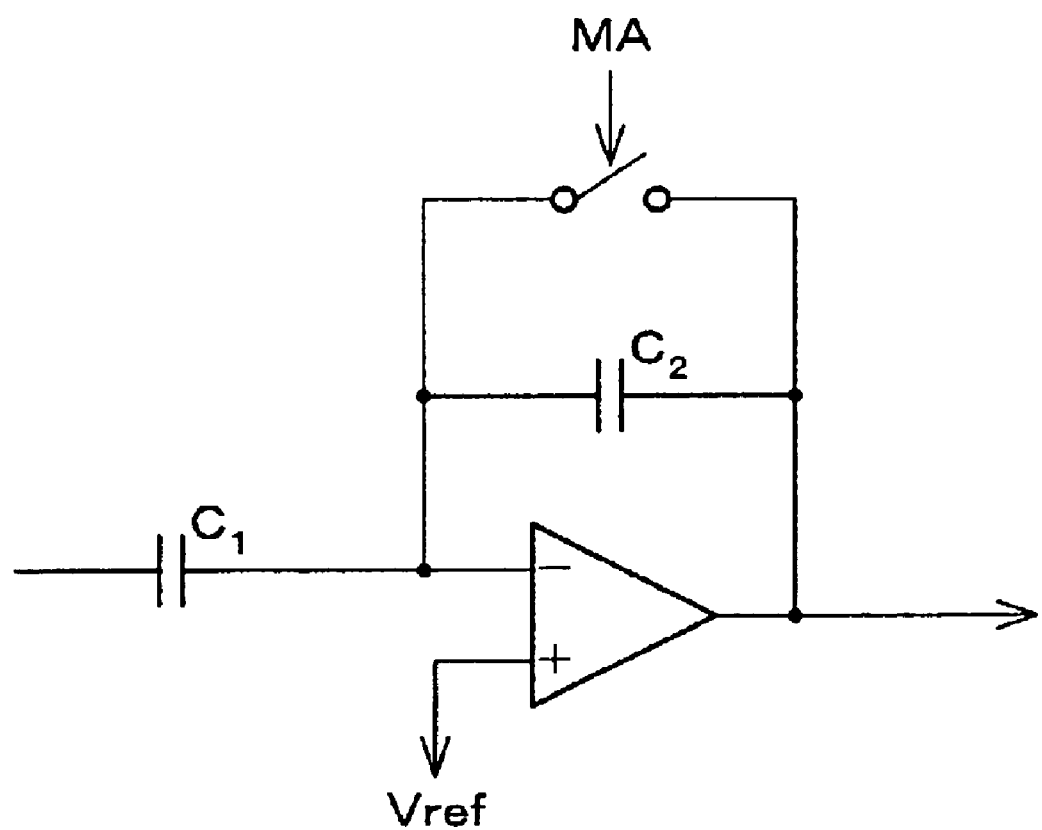
FIG. 8 is a circuit diagram showing an example of a circuit as an MA.
Figure 9:
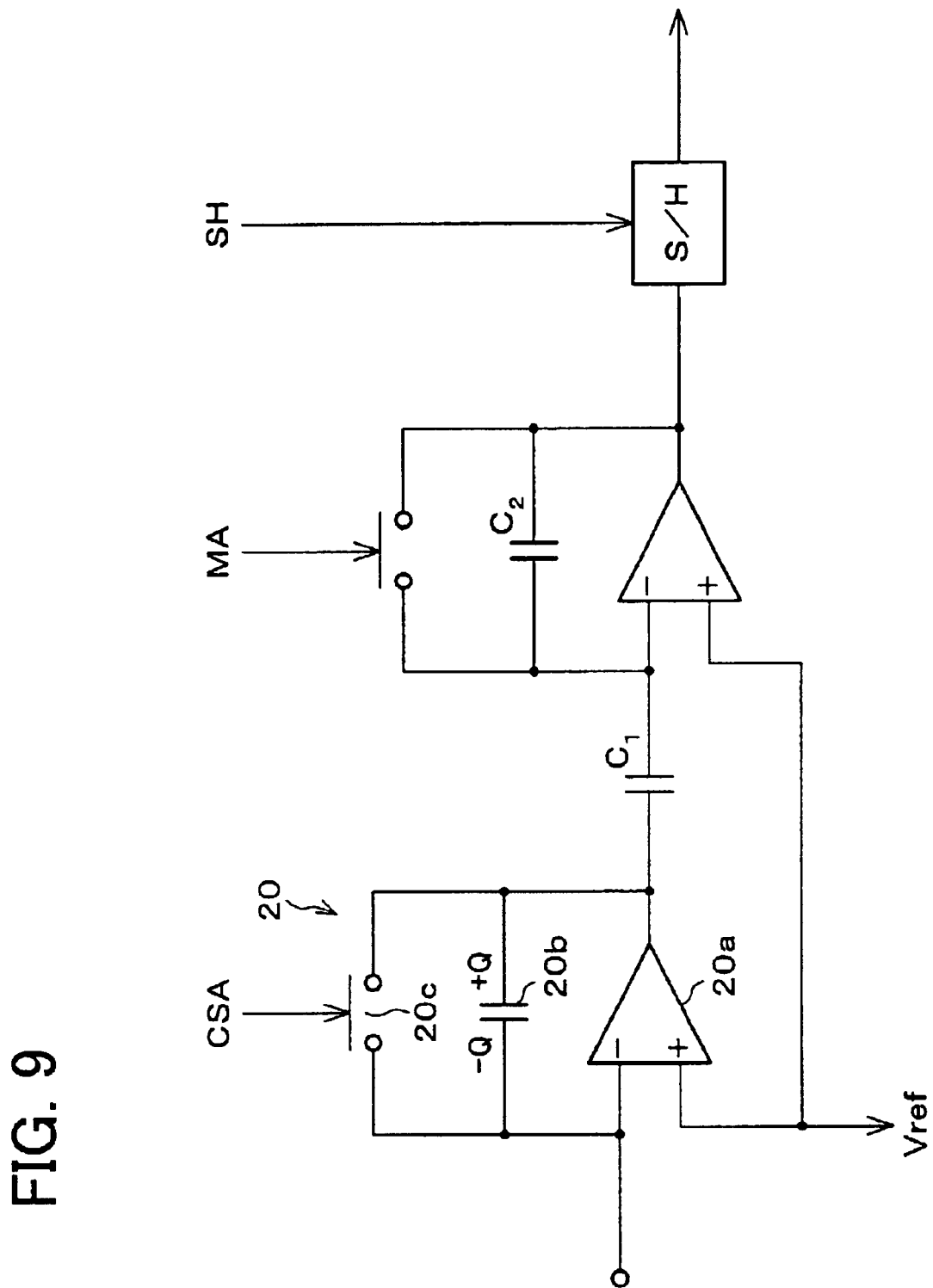
FIG. 9 is a circuit diagram of (CSA+MA+S/H) using the circuit shown in FIG. 8.

In case where a large number of reading circuits 16 each of which includes CSA are integrated to construct an LSI (Large-Scale Integrated Circuit), a typical MA is composed of one reverse amplifier as shown in FIG. 8, and amplification factor G is:

$|G|=C1/C2.$ (CSA+MA+S/H) circuit when the circuit shown in FIG. 8 is used as an MA is connected in the order of the CSA 20, the MA, and the S/H, as shown in FIG. 9.

Note that, the S/H is a circuit for sampling the output of the MA in the period that its control signal SH is High and for holding the sampled voltage until the control signal SH turns High next time.

Figure 10:
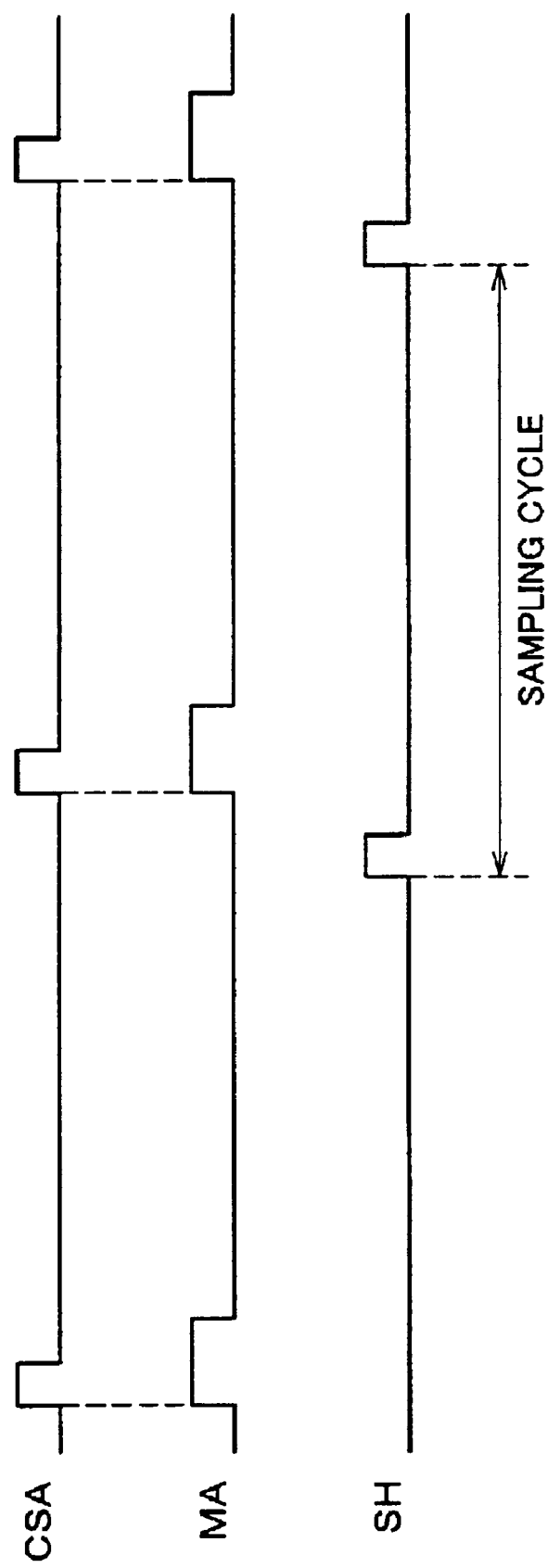
FIG. 10 is an explanatory view showing control timing when the circuit shown in FIG. 9 is caused to operate normally.

A control signal of (CSA+MA+S/H) circuit shown in FIG. 9 has control timings as shown in FIG. 10.

More specifically, with respect to the CSA 20 and the MA, initialization switches are turned on at the same time. Thereafter, the switch of the CSA 20 is turned off, and then the switch of the MA is turned off. This initializes both the CSA 20 and the MA, and converts charges to be supplied later into voltage.

The output of the MA is sampled by the S/H circuit in the period that the control signal SH of the S/H circuit is High, and the output is held until the control signal SH of the S/H circuit turns High next time. The held output signal (voltage) is converted into a digital value by the ADC which is the subsequent stage of the S/H. Note that, the period from the moment when the control signal SH turns High to the moment when the control signal SH turns High next time, that is, a pulse interval of the SH is a sampling cycle. Its inverse number is referred to as a sampling frequency. The control signal SH shown in FIG. 10 is a signal when the circuit operates normally.

Figure 1:
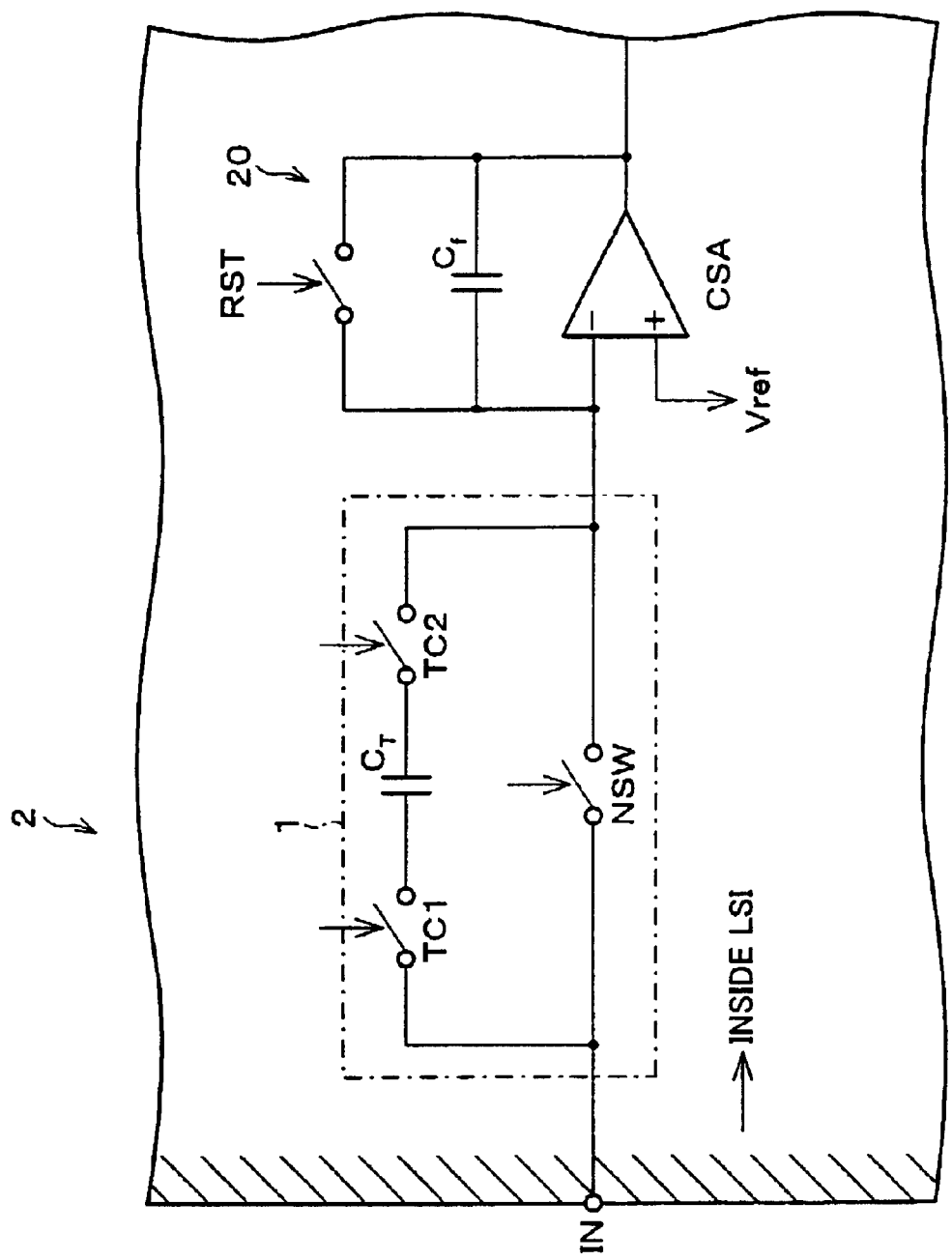
FIG. 1 is a circuit diagram partially showing an LSI in which testing circuits according to one embodiment of the present invention are integrated.

Here, referring to FIG. 1, the following will specifically describe the testing circuit 1, which is a testing circuit for the reading circuit (charge detection circuit) 16 included in the image sensor 48, according to the testing circuit for the charge detection circuit of the present invention.

As shown in FIG. 1, the testing circuit 1 of the present embodiment includes a switch NSW (a third switch), a capacitor CT which is connected in parallel to the switch NSW, and switches TC1 (a first switch) and TC2 (a second switch) which are connected in series across the capacitor CT. The testing circuit 1 is provided inside the LSI 2 between an input terminal IN of an LSI 2 and the CSA 20 described previously.

Except when a testing for the reading circuit 16 is carried out, that is, when the reading circuit 16 operates normally, in the testing circuit 1, the switch NSW is turned on, and the switches TC1 and TC2 are turned off.

On the other hand, when the testing of the reading circuit 16 is carried out, the testing circuit 1 turns off the switch NSW and turns on only the TC1 first so as to store the charge in the capacitor CT. Then, by turning off the TC1 and turning on the TC2, it is possible to supply the charge from the capacitor CT inserted between the input terminal IN and the CSA 20 to the CSA 20 included in the reading circuit 16.

With this, the circuit including the capacitor CT and the CSA 20 can serve as a reverse amplifier circuit and can input a voltage waveform instead of the charges. Therefore, the conventional charge supply circuit is not necessary when the testing of the reading circuit 16 is carried out.

In an actual testing of the reading circuit 16 in the LSI 2 shown in FIG. 1, an alternating signal is first supplied to the input terminal IN of the LSI 2 from an LSI testing device not shown. In the LSI 2, after the alternating signal is amplified by the MA shown in FIG. 7, it is sampled and held by the S/H. Then, the amplified alternating signal is converted into digital value by the ADC.

Here, by adjustment of the frequency of the alternating signal and the cycle of the S/H, it is possible to obtain digital output data string which can reproduce the alternating signal. By comparison between the inputted alternating signal and the alternating signal reproduced from the output data string, it is possible to check whether or not the reading circuit 16 (CSA 20) included in the LSI 2 operates normally. Also, it is possible to measure characteristics of the reading circuit 16 such as amplification factor, linearity, and distortion rate.

As described above, in the testing circuit 1 of the present embodiment, by inserting the capacitor CT between the input terminal IN of the LSI 2 and the CSA 20 in the test mode, it is possible to input the signal waveform to the input terminal IN of the LSI 2, so that it is possible to easily carry out the testing of the reading circuit 16.

Further, according to the testing circuit 1 of the present embodiment, it is possible to carry out a testing of the LSI 2 having the CSA 20. Still further, even in the LSI which is designed as a signal reading circuit such as an X-ray sensor which requires an extremely accurate measurement, it is possible to carry out an accurate measurement of characteristics for each terminal. Therefore, in manufacturing the LSIs 2, it is possible to increase efficiency in testing. Further, it is possible to improve the performance of the X-ray sensor by selecting LSIs having uniform characteristics in accordance with the result of the testing.

Figure 11:
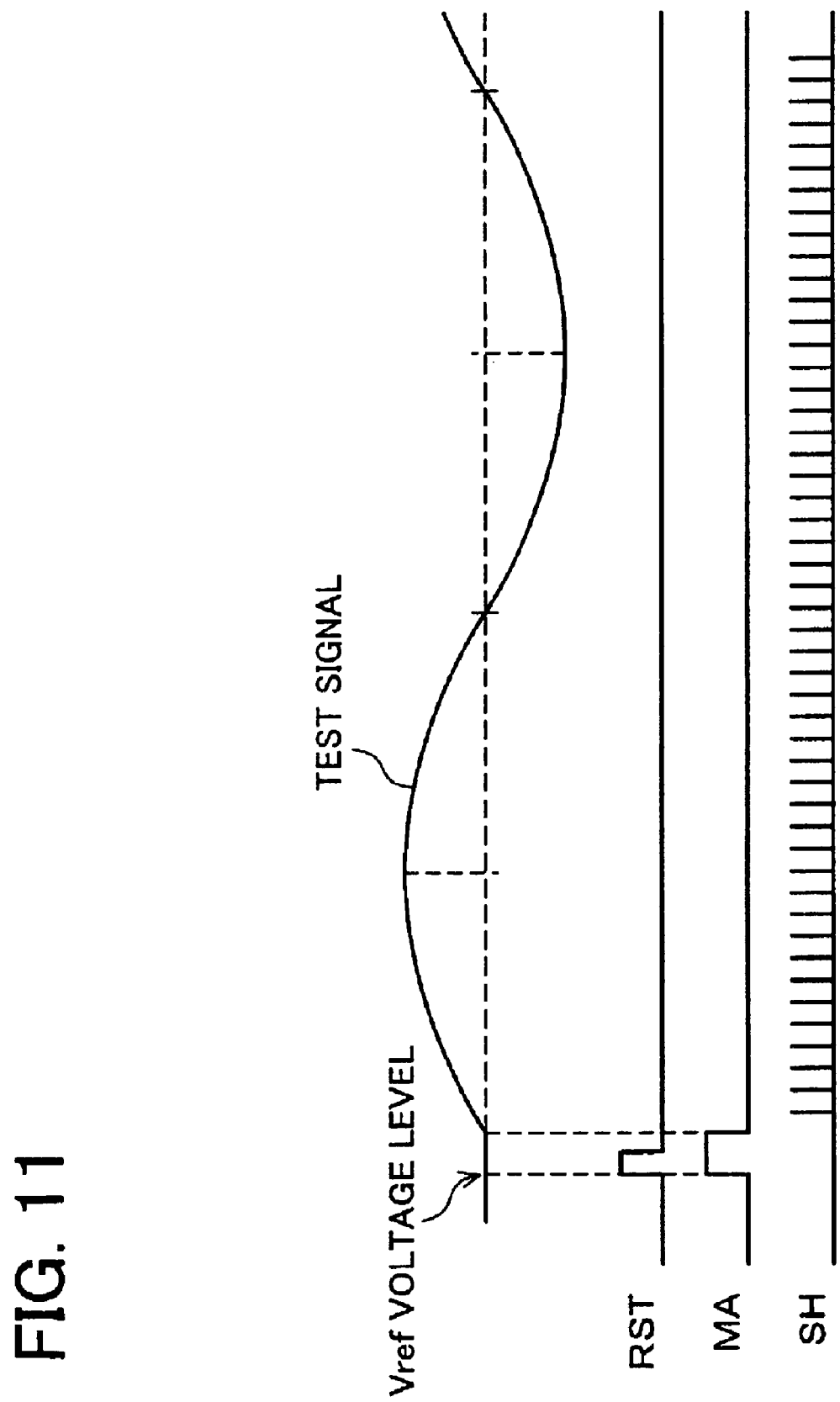
FIG. 11 is an explanatory view showing control timing by a testing method for the charge detection circuit of the present invention.
Figure 12:
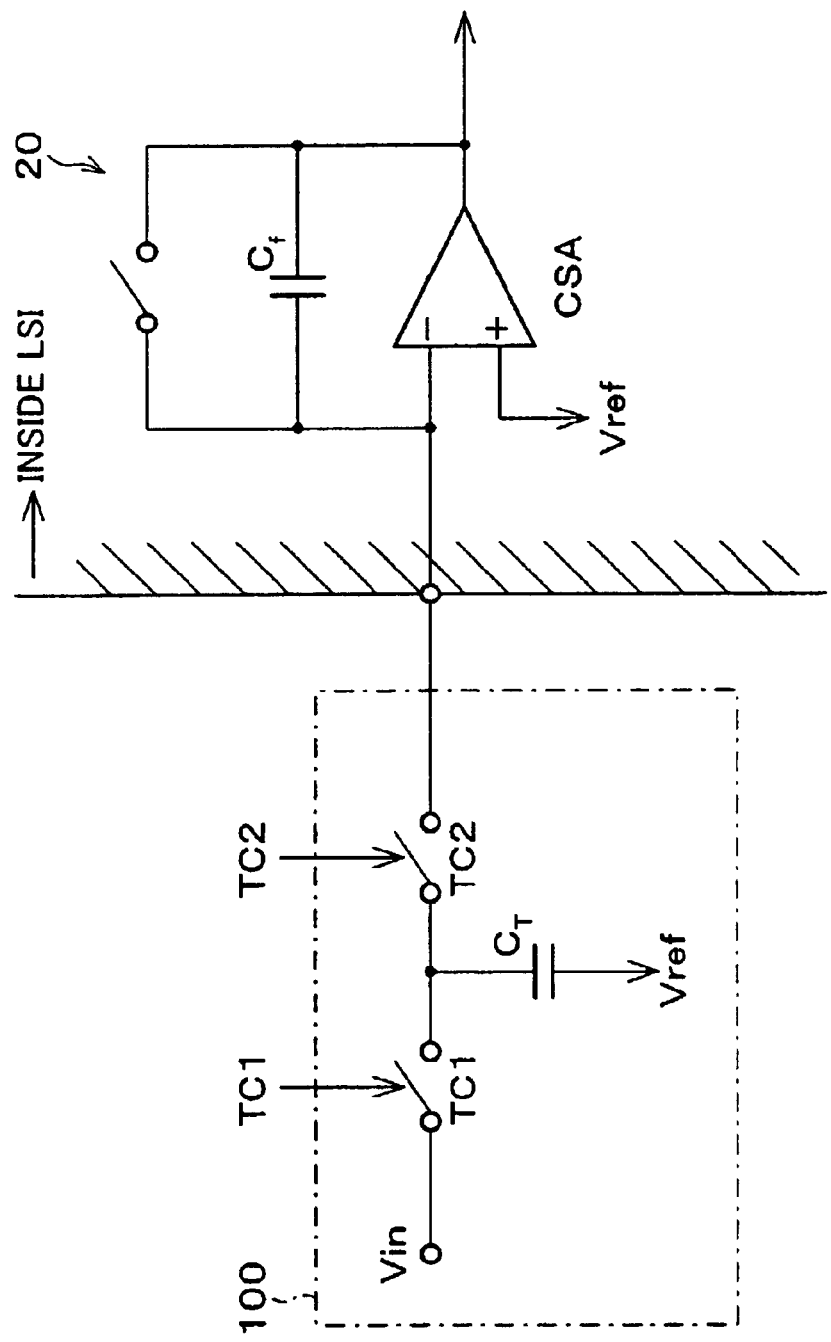
FIG. 12 is a circuit diagram showing an example of a circuit configuration for carrying out a testing for the operation of the conventional charge sensitive amplifier.

Here, referring to FIG. 11, the following will describe relations among the signal waveform to be inputted to the input terminal IN of the LSI 2, the control signal RST of the CSA 20, and the control signal MA of the MA when the MA is present in carrying out the testing using the testing circuit 1 of the present embodiment.

In the testing method of the present embodiment, as shown in FIG. 11, reset signals of RST and MA are inputted only first once. After that, the S/H is caused to operate without input of the signals. Further, the ADC is caused to operate by a control signal not shown. Still further, the MA and CSA 20 are reset simultaneously, so that offset does not occur in the output signal waveform of the MA. This makes the output signal waveform to change to the positive and negative sides with respect to Vref.

In the FIG. 11, during the period in which the control signal RST of the CSA 20 and the control signal MA of the MA are High, that is, during the period in which the CSA 20 and the MA are initialized, the input terminal IN is in the Vref level and the signal waveform is not applied. The signal waveform as described above is applied to the input terminal IN after RST and MA are Low, and the switch SW of the feedback capacitor Cf in the CSA 20 is turned off.

Next, the following will describe operations after the control signal RST of the CSA 20 turns Low.

At this point, the CSA 20 operates as a reverse amplifier having CT/Cf of amplification factor, so that the CSA 20 outputs a waveform having CT/Cf times amplitude and an inverted phase. The waveform outputted from the CSA 20 is amplified by the MA. Then, the amplified waveform is sampled and held by the S/H circuit, and converted into digital value in the ADC.

At this point, when the capacitances of the capacitor CT in the testing circuit 1 and the capacitor Cf of the feedback circuit in the CSA 20 are CT and Cf, respectively, the center value of the signal waveform is Vref, the amplitude is A, and the magnification of the MA is G, the output signal waveform of the MA becomes a waveform having $(CT/Cf) \times |G|$ times the amplitude of the input signal waveform, so that the amplitude of the output signal waveform of the MA is expressed by $A \times (CT/Cf) \times |G|$.

In the testing method for the charge detection circuit of the present embodiment, the amplitude of the output signal waveform of MA is determined so as not to go beyond a dynamic range of the reading circuit 16.

More specifically, when the voltage of the analog power supply of the operational amplifier in the LSI 2 are +VA and −VA with respect to Vref, the amplitude of the output signal waveform of MA is:

$$A \times (CT/Cf) \times |G| \leq VA.$$

If the inputted signal waveform is asymmetric with respect to Vref, and its absolute value are VA+ and VA− at positive and negative sides, respectively, the input signal waveform is determined so that the amplitude of the output signal waveform of the MA satisfies the equation of: $A \times (CT/Cf) \times |G| \leq \min(VA+, VA-)$. Note that, as to a right side value in the above equation, it means that either VA+ or VA− having a smaller value is adopted. VA+ represents a difference in voltage between the reference voltage and the power supply voltage of the positive side, and VA− represents a difference in potential between the reference voltage and the power supply voltage of the negative side.

In the testing method for the charge detection circuit of the present embodiment, the input signal waveform is determined so that the amplitude of the output signal waveform of the MA expressed by $A \times (CT/Cf) \times |G|$ falls in the range of operating voltage of an analog circuit of the LSI 2. This makes it possible to prevent the characteristics of the reading circuit 16 from not being measured accurately due to the occurrence of distortion with respect to the output signal waveform.

Further, the testing circuit 1 of the present embodiment, the capacitances of the inserted capacitor CT and the capacitor Cf of the feedback circuit of the CSA 20 satisfy the relation: CT=Cf.

This makes it possible to show almost equal input signal waveform and output signal waveform in case where the reading circuit 16 operates normally in the testing for checking operations of the reading circuit 16. Therefore, it is easy to compare between the input signal waveform and the output signal waveform.

More specifically, in case of the normal reading circuit 16, the output voltage can be expressed by $(CT/Cf) \times V$, where V is input voltage (signal waveform) in the testing for checking operations. That is, setting to CT=Cf makes it possible to equalize the signal waveforms at the time of input and output in case where the reading circuit 16 operates normally. Therefore, it is easy to compare the signal waveforms at the time of input and output, thereby clearly recognizing that the reading circuit 16 does not operate normally.

In order to minimize the variance of the CT/Cf ratio caused by the variation of the capacitances, it is desirable that the capacitances of the inserted capacitor CT and the capacitor Cf are CT=Cf, as described previously.

Note that, generally, the capacitance ratio CT/Cf of the capacitors provided inside the LSI is considerably accurate, as compared with the variation of the absolute value; however, it cannot avoid the variation of the order of 1%. This means that a system of measurement basically includes factors of such a variation. In case where a capacitor equal to the capacitor Cf in capacitance is used as a capacitor CT of the testing circuit 1, the capacitors can have exactly the same pattern (form), so that it is possible to minimize the variation of the ratio expressed by CT/Cf.

That is, for example, with respect to the capacitors CT and Cf having the same pattern of rectangle, even in case of the displacement of a mask, capacitors having the same pattern, which are provided on the same LSI, are out of alignment in the same way, so that the ratio of CT/Cf is hardly changed. Therefore, in case where the capacitors CT and Cf are formed in the same pattern, it is possible to minimize the variation of the ratio CT/Cf.

Note that, whether or not the waveform of the output voltage gets a minus sign with respect to the input voltage, depending on arrangements of each part in the circuit shown in FIG. 7, is not essential. Therefore, the presence of minus sign is not considered hereinafter except for essential parts.

Next, the following will describe the relation between a frequency and a period of S/H in case of the input signal waveform of sine wave.

By sampling theorem, if the frequency of input signal waveform is not more than fs/2 where the frequency of S/H is fs, it is possible to reproduce an original sine wave from digital data string obtained as output of the ADC.

Incidentally, a distortion rate cannot be measured only by satisfying this relation. Distortion means inclusion of harmonics of fundamental frequency. In order to detect the harmonics, the sampling frequency is required to be not less than twice the frequency of the harmonic.

Generally, a large part of energy of distortion component is included in the first to fourth harmonics. Therefore, in case of measurement of the distortion rate, harmonic components at least in the first to forth harmonics can be detected, and a sine wave having a frequency of ⅛ the frequency Fs of S/H can be inputted. Further, desirable for a highly accurate measurement is a frequency of not more than half the foregoing frequency, that is, a frequency of not more than ¹⁄₁₆ the frequency fs. For example, when fs is 20 kHz, a sine wave having a frequency ranging from 2.5 kHz to 1.25 kHz or less may be inputted. This makes it possible to carry out a highly accurate measurement of the distortion components.

According to the testing method using the testing circuit for the charge detection circuit of the present embodiment, the signal waveform which satisfies the above conditions is inputted in the testing circuit for the charge detection circuit, and the input signal waveform and a reproduced waveform (output signal waveform) are compared with each other so that it is possible to accurately measure circuit characteristics such as a distortion rate, offset, and magnification.

Note that, "a reproduced waveform" described here is strictly ideologized, and it is not necessary to actually carry out D/A conversion of digital data string outputted and reproduce an inputted analog signal. Actually, a general analog IC testing apparatus carries out an A/D conversion of the inputted analog signal waveform into digital data string, and the digital data is processed numerically so that harmonic components, a distortion rate, offset, etc. of the signal are calculated. That is, the calculation of a distortion rate, etc. is possible without reproducing a waveform by re-conversion of the converted digital signal into analog signal.

In the testing circuit 1 of the present embodiment, a test for checking operations and a test for detecting characteristics are easily carried out even if such an analog IC testing apparatus is used.

Note that, in the present embodiment, as an example of the inputted signal waveform given is a sine wave; however, the signal waveform is not limited to the sine wave. Generally the sine wave is used for the inputted signal waveform. However, for example, a lamp waveform, a triangular waveform, saw-tooth waveform, or other waveforms may be adopted.

Incidentally, as described in the present embodiment, it is preferable that the sine wave is adopted for the input signal waveform. More specifically, in case where waveforms except for sine wave is used for the input signal waveform, the signal waveform includes harmonics of not less than a fundamental frequency, so that it is impossible to accurately carry out a test of characteristics, etc. because the frequency of the harmonic is also considered to reproduce an original frequency. Further, the sine wave is a waveform that can be generated most easily, and that any signal generator can generate. Therefore, the use of the sine wave for the input signal waveform makes it possible to easily carry out the test regarding characteristics such as a distortion rate.

On the other hand, in case where waveforms such as a lamp waveform, including a part expressed by a linear function (a linear part) with respect to time, are used for the signal waveform, it is not necessary to consider a sampling theorem of S/H, so that sampling can be carried out in a proper cycle. This makes it possible to measure characteristics of a target reading circuit 16 by an analysis as to the linear part and linearity appeared as output of the charge detection circuit. Note that, "appeared as output of the circuit" described here is ideologized similarly as described above and indicates the use of the output obtained as digital data for analytical data, which does not mean to reproduce analog data.

Note that, the case where the output of the LSI 2 is obtained as digital data is explained above, the present invention is not limited to this. More specifically, the present invention does not basically care digital or analog output. For example, in case where analog data is output of the circuit because an analog/digital converter is not provided in the LSI 2, it is possible to analyze characteristics by inputting the outputted analog signal directly to a testing apparatus.

Further, an X-ray image sensor, etc. is composed of an extremely large number of pixels, and the charge detection circuit is necessary for each pixel, so that an extremely large number of charge detection circuits are necessary. Therefore, it is desirable that a large number of reading circuits as well as the charge detection circuit are also integrated so as to be LSI.

Consequently, according to the testing circuit for the charge detection circuit of the present invention, when the reading circuit 16 is tested and when the reading circuit 16 operates normally can be switched by ON/OFF operations, so that the testing circuit can be included in the LSI 2.

Still further, the charge detection circuit is an LSI in an extremely special field, and a conventional general testing apparatus for an analog IC is difficult to carry out a testing.

Consequently, according to the testing circuit for the charge detection circuit of the present invention, as to a testing circuit and a measuring method using the testing circuit for measuring characteristics of the charge detection circuit, it is possible to carry out a testing of charge detection circuits which require an extremely highly accurate charge reading, such as a reading circuit of a flat type X-ray image sensor. Moreover, in case of using a general-purpose analog IC testing apparatus, it is also possible to accurately carry out the testing.

Note that, in the present embodiment, as described above, explained is that the testing circuit for the charge detection circuit of the present invention is used for the testing of the LSI 2 including integrated reading circuits 16, such as an X-ray sensor, which require an accurate detection of an extremely small signal. However, the present invention is not limited to this. Any apparatuses can accurately and easily carry out a testing for checking operations of the apparatus itself, provided that the apparatuses includes a circuit which is provided with a charge sensitive amplifier other than the charge detection circuit.

Yet further, the present invention can be expressed as a testing circuit for an LSI including a large number of charge detection amplifiers integrated, which is arranged in such a manner that a capacitor is inserted between an input terminal of the LSI and the charge detection amplifier corresponding to the input terminal in the testing of the LSI.

Further, the present invention can be expressed as a testing circuit for a charge detection circuit, which observes a signal outputted from the charge detection circuit in response to a signal waveform supplied from voltage applying means so as to check whether or not the charge detection circuit operates normally, the testing circuit including:

a capacitor for causing the charge detection circuit to serve as a reverse amplifier circuit with respect to voltage input; and switching means for providing the capacitor between an output terminal of the voltage applying means and the charge detection circuit when the charge detection circuit is tested, and for causing not to operate the capacitor when the charge detection circuit regularly operates.

This does not require connection of the conventional charge supply apparatus every time the testing is carried out, so that it is possible to easily carry out an accurate testing of the charge detection circuit.

Still further, it is preferable that the switching means includes first and second switches connected in series across the capacitor, and a third switch connected in parallel to the capacitor.

This makes it possible to easily switch a regular operation mode and a testing mode for checking operations of the charge detection circuit, and to easily carry out the testing for checking operations of the charge detection circuit.

More specifically, when the charge detection circuit operates regularly, only the third switch is turned ON. When the testing for checking operations of the charge detection circuit is carried out, only the first switch is turned ON first so that charges are stored in the capacitor. Then, both the first switch and the second switch are turned ON, and the capacitor is inserted at the preceding stage of the charge detection circuit. With this, the circuit including the capacitor and the charge sensitive amplifier (CSA) can serve as a reverse amplifier circuit and can input a voltage waveform instead of the charges. Therefore, it is not necessary to provide the charge supply circuit which has been necessary in the conventional testing, so that it is possible to easily carry out the testing for checking operations of the charge detection circuit only by applying a signal waveform to the input terminal.

Further, it is preferable that the capacitor has a capacitance equal to that of a feedback capacitor of a charge sensitive amplifier provided in the charge detection circuit.

This makes it possible to show equal input signal waveform and output signal waveform in case where the charge detection circuit operates normally in the testing for checking operations of the charge detection circuit, so that it is possible to easily compare between the input signal waveform and the output signal waveform.

More specifically, in case where the charge detection circuit operates normally, the output voltage can be expressed by −(CT/Cf)×V, where V is input voltage (signal waveform) in the testing for checking operations of the charge detection circuit. That is, setting to CT=Cf makes it possible to equalize the amplitude of the signal waveforms at the time of input and output in case where the charge detection circuit operates normally, so that comparison of both signal waveforms can be easily carried out. Therefore, in case where the charge detection circuit does not operate normally, its malfunction can be easily found out. Also, even in case where the outputted signal waveform includes distortion components and the like, it is possible to compare both signal waveforms easily, so that it is possible to accurately detect characteristics of the charge detection circuit.

In order to solve the above problem, an LSI of the present invention includes:

a plurality of charge detection circuits integrated; and a testing circuit for a charge detection circuit, which includes:

(a) a capacitor for causing the charge detection circuit to serve as a reverse amplifier circuit with respect to voltage input; and (b) switching means for providing the capacitor between an input terminal of the LSI and the charge detection circuit when the charge detection circuit is tested and for causing not to operate the capacitor when the charge detection circuit regularly operates.

According to the above arrangement, the LSI itself is provided with the testing circuit for carrying out the testing for checking operations of the charge detection circuit therein. Therefore, it is possible to easily switch a regular operation mode and a testing mode for checking operations of the charge detection circuit only by switching the switching means to delete (cause not to operate) or insert the capacitor, and to easily carry out the testing for checking operations of the charge detection circuit.

Therefore, it is possible to save the trouble of connecting the conventional charge supply circuit to an input section of the charge detection circuit in order to supply charges to the charge detection circuit when the testing for checking operation is carried out, and it is possible to efficiently carry out the testing for checking operations of the charge detection circuit only by applying the signal waveform to the input terminal.

Further, in order to solve the above problem, a testing method for a charge detection circuit of the present invention for observing a signal outputted from the charge detection circuit in response to a signal waveform supplied from voltage applying means so as to check whether or not the charge detection circuit operates normally, includes the steps of:

inserting a capacitor for causing the charge detection circuit to serve as a reverse amplifier circuit with respect to voltage input; and switching so that the capacitor is provided between an output terminal of the voltage applying means and the charge detection circuit when the charge detection circuit is tested, and the capacitor is caused not to operate when the charge detection circuit regularly operates.

According to the above method, it is possible to switch a testing mode for checking operations and a regular operation mode of the charge detection circuit by not inserting the capacitor in case where the charge detection circuit operates regularly and by inserting the capacitor in case where the testing for checking operations is carried out with respect to the charge detection circuit. Also, it is possible to easily carry out the testing for checking operations of the charge detection circuit.

More specifically, in the testing method for the charge detection circuit of the present invention, whether the capacitor for serving the charge detection circuit as a reverse amplifier circuit with respect to the voltage input is inserted or not is determined by switching the testing mode for checking operations and the regular operation mode. With this arrangement, the charge detection circuit can conduct regular operations with the testing circuit provided. Then, it is possible to easily carry out the testing for checking operations of the charge detection circuit by comparing and observing between the signal waveform applied to the input terminal and the signal waveform outputted.

Further, according to the testing method for the charge detection circuit of the present invention, it is possible to switch the regular operation mode and the testing mode for checking operations of the charge detection circuit only by deleting (causing not to operate) or inserting the capacitor, so that the testing circuit for the charge detection circuit can be provided inside devices such as an LSI. Therefore, it is possible to save the trouble of connecting the conventional charge supply circuit to an input section of the charge detection circuit in order to supply charges to the charge detection circuit when the testing for checking operations is carried out, and it is possible to efficiently carry out the testing for checking operations of the charge detection circuit only by inputting the signal waveform to the input terminal.

Further, when (1) a signal waveform having a sine wave is supplied from the output terminal, and (2) a central value of the sine wave is equal to that of a reference voltage supplied to a non-inverting input terminal of a charge sensitive amplifier which is included in the charge detection circuit, it is more preferable that an input signal waveform is determined so that an amplitude of an output signal waveform having a sine wave of the charge sensitive amplifier satisfies an equation:

$$A \times (CT/Cf) \times |G| \leq \min(VA+, VA-),$$

where VA+ indicates a difference in voltage between the reference voltage and a power supply voltage of a positive side, and VA− indicates a difference in voltage between the reference voltage and supply power voltage of a negative side, and A is an amplitude of the sine wave, Cf is a capacitance of a feedback capacitor of the charge sensitive amplifier, CT is a capacitance of the capacitor in the testing circuit for the charge detection circuit, and G is an amplification factor of the charge sensitive amplifier.

With this, it is possible to accurately measure characteristics of the charge detection circuit in such a manner that the input signal waveform is determined so that the amplitude of the output signal waveform having a sine wave from the charge sensitive amplifier satisfies the above equation.

More specifically, the amplitude of the output signal waveform of the charge sensitive amplifier provided in the charge detection circuit becomes (CT/Cf)×|G| times the amplitude of the input signal waveform, so that the amplitude of the output signal waveform of the charge sensitive amplifier becomes A×(CT/Cf)×|G|. In case where the amplitude of the output signal waveform does not fall in the operating range of the analog circuit of the charge detection circuit, distortion occurs in the output signal waveform. This causes inaccurate measurement of characteristics of the charge detection circuit using the output signal waveform of an amplifying circuit. Therefore, it is possible to accurately measure characteristics of the charge detection circuit in such a manner that the input signal waveform is determined so that the amplitude of the output signal waveform of the charge sensitive amplifier satisfies the above equation.

Note that, as to a right side value in the above equation, it means that either VA+ or VA− having a smaller value is adopted. VA+ represents a difference in voltage between the reference voltage and the power supply voltage of the positive side, and VA− represents a difference in potential between the reference voltage and the power supply voltage of the negative side.

Further, it is more preferable that the sine wave is set so as to have a frequency of not more than fs/8, where fs is a sampling frequency of a sampling circuit which is positioned on an output side of the charge sensitive amplifier.

This makes it possible to accurately detect this distortion components in case where distortion is included in the output signal.

More specifically, distortion of the waveform of the output signal means inclusion of harmonics of fundamental frequency. In order to detect the harmonics, the sampling frequency can be not less than twice the frequency of the harmonic. Generally, a large part of energy of distortion component is concentrated in the fourth harmonic and the preceding harmonics. Therefore, it is possible to more surely detect distortion components included in the waveform of the output signal by inputting the sine wave having a frequency of not less than fs/8, where fs is a sampling frequency.

Still further, the signal waveform supplied from the output terminal may have a waveform including a linear part expressed by a linear function with respect to time.

With this arrangement, by using waveforms such as a lamp waveform, including a linear part expressed by a linear function with respect to time for the inputted signal waveform, it is not necessary to consider a sampling theorem of the sampling circuit, so that a sampling frequency can be set properly. This makes it possible to easily measure characteristics of the charge detection circuit by an analysis as to the linear part and linearity appeared as output of the charge detection circuit.

In order to solve the above problem, a testing circuit for a charge detection circuit of the present invention, includes:
   an input terminal which is connected to voltage applying means for supplying a signal waveform for testing to the charge detection circuit;
   a capacitor which is inserted or not inserted in series between the input terminal and the charge detection circuit; and
   switching means for conducting insert or non-insert operations of the capacitor.

According to the above arrangement, the switching means can easily switch a testing mode for checking operations and a regular operation mode of the charge detection circuit by not inserting the capacitor in case where the charge detection circuit operates regularly and by inserting the capacitor in case where the testing for checking operations is carried out with respect to the charge detection circuit. Also, it is possible to easily carry out the testing for checking operations of the charge detection circuit.

More specifically, the testing circuit for the charge detection circuit according to the present invention is provided with the capacitor for causing the charge detection circuit to operate as a voltage input circuit, and the switching means for determining whether the capacitor is inserted or not.

With this arrangement, the charge detection circuit can conduct regular operations with the testing circuit provided by deleting (causing not to operate) the capacitor in the regular operation and by inserting the capacitor in the testing for checking operations of the charge detection circuit.

More specifically, in case where the testing for the charge detection circuit is carried out, the capacitor is inserted so that the capacitor and the charge detection circuit can serve as a reverse amplifier circuit. It is possible to easily carry out the testing for checking operations of the charge detection circuit by comparing and observing between the signal waveform applied to the input terminal and the signal waveform outputted.

Further, according to the testing circuit for the charge detection circuit of the present invention, the switching means can switch the regular operation mode and the testing mode for checking operations of the charge detection circuit only by deleting (causing not to operate) or inserting the capacitor, so that the testing circuit for the charge detection circuit can be provided inside devices such as an LSI. Therefore, it is not necessary to connect the conventional charge supply circuit to the input section of the charge detection circuit for the charge supply to the charge detection circuit in the testing for checking operations of the charge detection circuit. This makes it possible to efficiently carry out the testing for checking operations of the charge detection circuit only by supplying the signal waveform to the input terminal.

In order to solve the above problem, a testing circuit for a charge detection circuit of the present invention, includes:
   an input terminal which is connected to voltage applying means for supplying a signal waveform for testing to the charge detection circuit;
   a capacitor which is inserted or not inserted in series between the input terminal and the charge detection circuit;
   first and second switches which are connected in series across the capacitor; and
   a third switch which is connected in parallel to the capacitor.

According to the above arrangement, it is possible to easily switch the regular operation mode and the testing mode for checking operations of the charge detection circuit, and to easily carry out the testing for checking operations of the charge detection circuit.

More specifically, when the charge detection circuit operates regularly, only the third switch is turned ON. When the testing for checking operations of the charge detection circuit is carried out, only the first switch is turned ON first so that charges are stored in the capacitor. Then, both the first switch and the second switch are turned ON, and the capacitor is inserted at the preceding stage of the charge detection circuit. With this, the circuit including the capacitor and the charge sensitive amplifier (CSA) can serve as a reverse amplifier circuit and can input a voltage waveform instead of the charges. Therefore, it is not necessary to provide the charge supply circuit which has been necessary in the conventional testing, so that it is possible to easily carry out the testing for checking operations of the charge detection circuit only by applying a signal waveform to the input terminal.

In order to solve the above problem, an LSI of the present invention includes integrated plural charge detection circuits, each of which is provided with a testing circuit for the charge detection circuit, the testing circuit including:
   an input terminal which is connected to voltage applying means for supplying a signal waveform for testing to the charge detection circuit;

a capacitor which is inserted or not inserted in series between the input terminal and the charge detection circuit; and switching means for conducting insert or non-insert operations of the capacitor.

According to the above arrangement, the LSI itself is provided with the testing circuit for carrying out the testing for checking operations of the charge detection circuit therein. Therefore, it is possible to easily switch a regular operation mode and a testing mode for checking operations of the charge detection circuit only by switching the switching means to delete (cause not to operate) or insert the capacitor, and to easily carry out the testing for checking operations of the charge detection circuit.

Therefore, it is possible to save the trouble of connecting the conventional charge supply circuit to an input section of the charge detection circuit in order to supply charges to the charge detection circuit when the testing for checking operation is carried out, and it is possible to efficiently carry out the testing for checking operations of the charge detection circuit only by applying the signal waveform to the input terminal.

In order to solve the above problem, an image sensor of the present invention includes:

a photoelectric converting section for converting photons into charges and storing the charges; and integrated plural charge detection circuits for reading signals of charges supplied from the photoelectric converting section, each of which is provided with a testing circuit for the charge detection circuit, the testing circuit including:

an input terminal which is connected to voltage applying means for supplying a signal waveform for testing to the charge detection circuit;

a capacitor which is inserted or not inserted in series between the input terminal and the charge detection circuit; and switching means for conducting insert or non-insert operations of the capacitor.

According to the above arrangement, it is possible to obtain the image sensor which is provided with the testing circuit for testing whether or not charge detection is carried out normally by the charge detection circuit for reading signals of charges supplied from the photoelectric converting section for converting photons such as X-rays into charges.

This makes it possible to easily switch the regular operation mode and the testing mode by the switching means. In the testing mode, it is possible to save the trouble of connecting the conventional charge supply circuit to an input section of the charge detection circuit in order to supply charges to the charge detection circuit when the testing for checking operation is carried out, and it is possible to efficiently carry out the testing for checking operations of the charge detection circuit only by applying the signal waveform to the input terminal.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A testing circuit for a charge detection circuit, which observes a signal outputted from the charge detection circuit in response to a signal waveform supplied from voltage applying means so as to check whether or not the charge detection circuit operates normally, the testing circuit comprising:

a capacitor for causing the charge detection circuit to serve as a reverse amplifier circuit with respect to voltage input; and switching means for providing the capacitor between an output terminal of the voltage applying means and the charge detection circuit when the charge detection circuit is tested, and for not providing the capacitor when the charge detection circuit regularly operates.

2. The testing circuit for the charge detection circuit, according to claim 1, wherein the switching means includes first and second switches connected in series across the capacitor, and a third switch connected in parallel to the capacitor.

3. The testing circuit for the charge detection circuit, according to claim 1, wherein the capacitor has a capacitance equal to that of a feedback capacitor of a charge sensitive amplifier provided in the charge detection circuit.

4. An LSI comprising:

a plurality of charge detection circuits integrated; and a testing circuit for a charge detection circuit, which includes:

(a) a capacitor for causing the charge detection circuit to serve as a reverse amplifier circuit with respect to voltage input; and (b) switching means for providing the capacitor between an input terminal of the LSI and the charge detection circuit when the charge detection circuit is tested and for not providing the capacitor when the charge detection circuit regularly operates.

5. A testing method for a charge detection circuit, for observing a signal outputted from the charge detection circuit in response to a signal waveform supplied from voltage applying means so as to check whether or not the charge detection circuit operates normally, the testing method comprising the steps of:

inserting a capacitor for causing the charge detection circuit to serve as a reverse amplifier circuit with respect to voltage input; and switching so that the capacitor is provided between an output terminal of the voltage applying means and the charge detection circuit when the charge detection circuit is tested, and the capacitor is not provided when the charge detection circuit regularly operates.

6. The testing method for the charge detection circuit according to claim 5, wherein:

when (1) a signal waveform having a sine wave is supplied from the output terminal, and (2) a central value of the sine wave is equal to that of a reference voltage supplied to a non-inverting input terminal of a charge sensitive amplifier which is included in the charge detection circuit, an input signal waveform is determined so that an amplitude of an output signal waveform having a sine wave of the charge sensitive amplifier satisfies an equation:

$$A \times (CT/Cf) \times |G| \leq \min(VA+, VA-),$$

where VA+ indicates a difference in voltage between the reference voltage and a power supply voltage of a positive side, and VA− indicates a difference in voltage between the reference voltage and supply power voltage of a negative side, and A is an amplitude of the sine wave, Cf is a capacitance of a feedback capacitor of the charge sensitive amplifier, CT is a capacitance of the capacitor in the testing circuit for the charge detection circuit, and G is an amplification factor of the charge sensitive amplifier.

7. The testing method for the charge detection circuit according to claim 6, wherein the sine wave is set so as to have a frequency of not more than fs/8, where fs is a sampling frequency of a sampling circuit which is positioned on an output side of the charge sensitive amplifier.

8. The testing method for the charge detection circuit according to claim 5, wherein the signal waveform supplied from the output terminal has a waveform including a linear part expressed by a linear function with respect to time.

9. A testing circuit for a charge detection circuit, comprising:

an input terminal which is connected to voltage applying means for supplying a signal waveform for testing to the charge detection circuit;

a capacitor which is inserted or not inserted in series between the input terminal and the charge detection circuit; and switching means for conducting insert or non-insert operations of the capacitor.

10. A testing circuit for a charge detection circuit, comprising:

an input terminal which is connected to voltage applying means for supplying a signal waveform for testing to the charge detection circuit;

a capacitor which is inserted or not inserted in series between the input terminal and the charge detection circuit;

first and second switches which are connected in series across the capacitor; and a third switch which is connected in parallel to the capacitor.

11. An LSI including integrated plural charge detection circuits, each of which is provided with a testing circuit for the charge detection circuit, the testing circuit including:

an input terminal which is connected to voltage applying means for supplying a signal waveform for testing to the charge detection circuit;

a capacitor which is inserted or not inserted in series between the input terminal and the charge detection circuit; and switching means for conducting insert or non-insert operations of the capacitor.

12. An image sensor comprising:

a photoelectric converting section for converting photons into charges and storing the charges; and plural charge detection circuits for reading signals of charges supplied from the photoelectric converting section, each of which is provided with a testing circuit for the charge detection circuit, the photoelectric converting section and the charge detection circuits being integrated, the testing circuit including:

an input terminal which is connected to voltage applying means for supplying a signal waveform for testing to the charge detection circuit;

a capacitor which is inserted or not inserted in series between the input terminal and the charge detection circuit; and switching means for conducting insert or non-insert operations of the capacitor.

* * * * *